United States Patent
Komatsu et al.

(10) Patent No.: US 10,541,220 B1
(45) Date of Patent: Jan. 21, 2020

(54) PRINTED REPASSIVATION FOR WAFER CHIP SCALE PACKAGING

(71) Applicant: Texas Instruments Incorporated, Dallas, TX (US)

(72) Inventors: Daiki Komatsu, Beppu (JP); Makoto Shibuya, Beppu (JP); Yi Yan, Milpitas, CA (US); Hau Nguyen, San Jose, CA (US); Luu Thanh Nguyen, San Jose, CA (US); Anindya Poddar, Sunnyvale, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/053,199

(22) Filed: Aug. 2, 2018

(51) Int. Cl.
| | |
|---|---|
| H01L 21/48 | (2006.01) |
| H01L 21/56 | (2006.01) |
| H01L 21/78 | (2006.01) |
| H01L 23/00 | (2006.01) |
| H01L 23/367 | (2006.01) |
| H01L 23/498 | (2006.01) |
| H01L 23/495 | (2006.01) |
| H01L 23/31 | (2006.01) |

(52) U.S. Cl.
CPC .......... *H01L 24/11* (2013.01); *H01L 21/4825* (2013.01); *H01L 21/4853* (2013.01); *H01L 21/4882* (2013.01); *H01L 21/565* (2013.01); *H01L 21/78* (2013.01); *H01L 23/3114* (2013.01); *H01L 23/3675* (2013.01); *H01L 23/4951* (2013.01); *H01L 23/49838* (2013.01); *H01L 24/13* (2013.01); *H01L 24/16* (2013.01); *H01L 2224/1145* (2013.01); *H01L 2224/1191* (2013.01); *H01L 2224/11462* (2013.01); *H01L 2224/11515* (2013.01); *H01L 2224/11618* (2013.01); *H01L 2224/13008* (2013.01); *H01L 2224/13147* (2013.01); *H01L 2224/16157* (2013.01); *H01L 2224/16175* (2013.01)

(58) Field of Classification Search
CPC ..................................................... H01L 21/561
See application file for complete search history.

(56) References Cited

U.S. PATENT DOCUMENTS

| | | | |
|---|---|---|---|
| 8,450,151 B1 | 5/2013 | Poddar et al. | |
| 9,663,357 B2 | 5/2017 | Mao et al. | |
| 2011/0227219 A1* | 9/2011 | Alvarado | ................ H01L 24/03 257/738 |
| 2013/0037802 A1* | 2/2013 | England | ................ H01L 21/568 257/48 |
| 2013/0127044 A1 | 5/2013 | Poddar et al. | |
| 2017/0125325 A1 | 5/2017 | Shibuya | |
| 2018/0122731 A1 | 5/2018 | Komatsu et al. | |

\* cited by examiner

*Primary Examiner* — William A Harriston
(74) *Attorney, Agent, or Firm* — Ronald O. Neerings; Charles A. Brill; Frank D. Cimino

(57) ABSTRACT

Described examples provide integrated circuits and methods, including forming a conductive seed layer at least partially above a conductive feature of a wafer, forming a conductive structure on at least a portion of the conductive seed layer, performing a printing process that forms a polymer material on a side of the wafer proximate a side of the conductive structure, curing the deposited polymer material, and attaching a solder ball structure to a side of the conductive structure.

26 Claims, 13 Drawing Sheets

PRINTED REPASSIVATION FOR WAFER CHIP SCALE PACKAGING

BACKGROUND

Integrated circuits and packaged electronic components (e.g., microelectronic devices) are often produced from a semiconductor-based die or chip with one or more electronic components. A variety of integrated packaging types are available, including flip-chip ball grid array (FC-BGA) direct surface mountable packages. FC-BGA include a die mounted to a substrate, such as a printed circuit board (PCB), which in turn has conductive pads or balls for soldering to a user board. Wafer chip scale packaging or wafer level chip scale packaging (WCSP or WLCSP) technology is employed in manufacturing flip-chip BGA devices. In one WCSP process, lithographic steps are performed on a wafer or die to spin coat, expose, develop, and etch a repassivation layer with patterned openings at locations for formation of copper pillar contact structures and subsequent solder ball drop or placement prior to surface mount soldering of the die to a carrier substrate. The repassivation material protects the copper and passivates the copper surface, and mechanically strengthens the base of the copper pillar during assembly to the carrier substrate. Further lithographic processing is required where redistribution layers (RDLs) are included in the die, and each repassivation layer adds an extra mask to the total cost of the process. Also, redistribution layer shorting can result from copper migration between redistribution layer features and ball placement locations.

SUMMARY

Described examples provide integrated circuits and methods, including forming a conductive seed layer at least partially above a conductive feature of a wafer, forming a conductive structure on at least a portion of the conductive seed layer, performing a printing process that forms a polymer material on a side of the wafer proximate a side of the conductive structure, curing the deposited polymer material, and attaching a solder ball structure to a side of the conductive structure. In certain examples, the printing process includes multiple printing passes to deposit multiple layers of the polymer material. In one example, a thermal cure material is printed, and the process includes heating the wafer while performing the printing process to at least partially cure the deposited polymer material. A final curing process is performed in one example after performing the printing process to thermally cure the polymer material. In another example, a UV curable material is printed, and the method further includes exposing the polymer material to ultraviolet light while performing the printing process. Some examples also include forming a conductive redistribution layer over a portion of the conductive structure after performing the printing process, and performing a second printing process that forms a second polymer material on the side of the wafer proximate a side of the conductive redistribution layer.

Further aspects of the disclosure provide a device that includes an electronic component disposed on or in a semiconductor substrate, a metallization structure disposed over the semiconductor substrate, including a conductive feature, a conductive contact structure electrically coupled with a conductive feature of the metallization structure, a printed polymer material disposed on the side of the wafer proximate a side of the conductive contact structure, and a solder ball structure connected to the conductive structure.

Another aspect of the disclosure provides an integrated circuit (IC) that includes a die with a substrate having an electronic component, and a metallization structure disposed over the substrate. The IC further includes a conductive contact structure electrically coupled with a conductive feature of the metallization structure, a printed polymer material disposed on the side of the wafer proximate a side of the conductive contact structure, and a package structure that encloses the die and provides electrical connection to the conductive contact structure.

DETAILED DESCRIPTION

Figure 1:
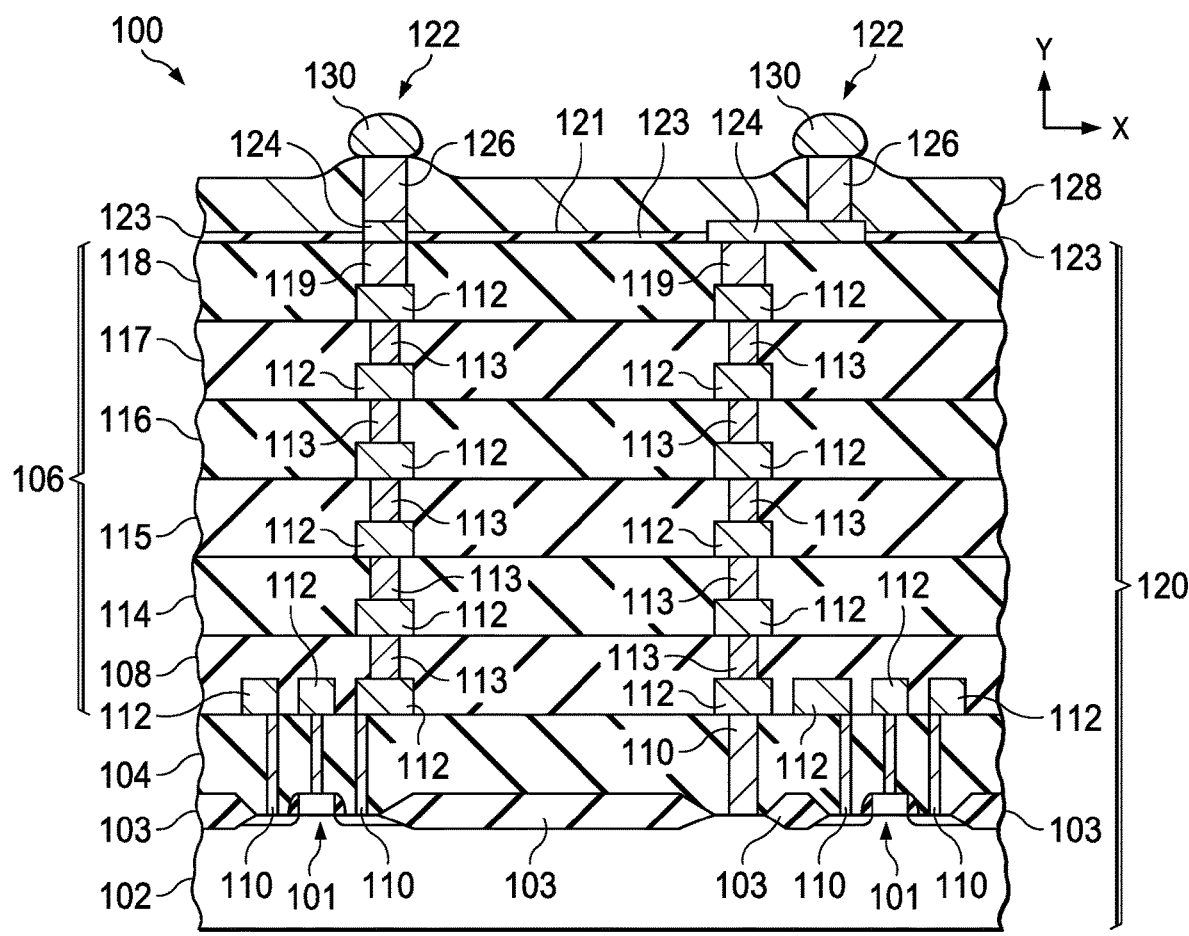
FIG. 1 is a partial sectional side elevation view of a microelectronic device with contact structures and a printed repassivation layer.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . ." Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

FIG. 1 shows a microelectronic device 100 that includes multiple electronic components 101 (e.g., metal oxide semiconductor (MOS) transistors) disposed on or in a semiconductor substrate 102. Although the example device 100 is an integrated circuit with multiple components 101, other microelectronic device implementations can include a single electronic component. The semiconductor substrate 102 in one example is a silicon wafer, a silicon-on-insulator (SOI) substrate or other semiconductor structure. Isolation structures 103 are disposed on select portions of an upper surface or side of the substrate 102. The isolation structures 103 can be shallow trench isolation (STI) features or field oxide (FOX) structures in some examples. The device 100 also includes a multi-layer metallization structure 104, 106 disposed above the substrate 102. The metallization structure includes a first dielectric structure layer 104 formed over the substrate 102, as well as a multi-level upper metallization structure 106. In one example, the first dielectric 104 structure layer is a pre-metal dielectric (PMD) layer disposed over the components 101 and the upper surface of the substrate 102. In one example, the first dielectric structure layer 104 includes silicon dioxide ($SiO_2$) deposited over the components 101, the substrate 102 and the isolation structures 103.

The example device 100 of FIG. 1 includes a 6 layer upper metallization structure 106 with a first layer 108, referred to herein as an interlayer or interlevel dielectric (ILD) layer. Different numbers of layers can be used in different implementations. In one example, the first ILD layer 108, and the other ILD layers of the upper metallization structure 106 are formed of silicon dioxide ($SiO_2$) or other suitable dielectric material. In certain implementations, the individual layers of the multi-layer upper metallization structure 106 are formed in two stages, including an intra-metal dielectric (IMD, not shown) sub layer and an ILD sublayer overlying the IMD sub layer. The individual IMD and ILD sublayers can be formed of any suitable dielectric material or materials, such as $SiO_2$-based dielectric materials. Tungsten or other conductive contacts 110 extend through selective portions of the first dielectric structure layer 104. The first ILD layer 108, and the subsequent ILD layers in the upper metallization structure 106 include conductive metallization interconnect structures 112, such as aluminum formed on the top surface of the underlying layer. In this example, the first layer 108 and the subsequent ILD layers also include conductive vias 113, such as tungsten, providing electrical connection from the metallization features 112 of an individual layer to an overlying metallization layer. The example of FIG. 1 includes a second layer 114 disposed over the first layer 108. The ILD layer 108 includes conductive interconnect structures 112 and vias 113. The illustrated structure includes further metallization levels with corresponding dielectric layers 115, 116 and 117, as well as an uppermost or top metallization layer 118. The substrate 102, the electronic components 101, the first dielectric structure layer 104 and the upper metallization structure 106 form a wafer or die 120 with an upper side or surface 121. The individual layers 115-118 in this example include conductive interconnect structures 112 and associated vias 113.

The top metallization layer 118 includes two example conductive features 119, such as upper most aluminum vias. The conductive features 119 include a side or surface at the upper side 121 of the wafer or die 120 at the top of the uppermost metallization layer 118. Any number of conductive features 119 may be provided. One or more of the conductive features 119 can be electrically coupled with an electronic component 101. The upper ILD dielectric layer 118 in one example is covered by one or more passivation layers 123 (e.g., protective overcoat (PO) and/or passivation layers), for example, silicon nitride (SiN), silicon oxynitride ($SiO_xN_y$), or silicon dioxide ($SiO_2$). In one example, the passivation layer or layers 123 include one or more openings that expose a portion of the conductive features 119 to allow electrical connection of the features 119 to corresponding contact structures.

In the example of FIG. 1, the microelectronic device 100 includes two contact structures 122. The contact structures 122 extend outward (e.g., upward along the "Y" direction in FIG. 1) from the upper side 121 of the metallization structure 106. The individual contact structures 122 are electrically coupled with a corresponding one of the conductive features 119. The individual contact structures 122 include a conductive seed layer 124 and a copper structure 126. The microelectronic device 100 also includes a printed polymer material 128 disposed on the side 121 of the wafer 120 proximate a side of the conductive contact structure 122, and a solder ball structure 130 connected to the conductive structure 126. The conductive seed layer 124 is disposed at least partially on the corresponding conductive feature 119. In one example, the conductive seed layer 124 includes titanium (Ti) or titanium tungsten (TiW). The individual contact structures also include a copper structure 126 that extends at least partially outward (e.g., upward in FIG. 1) from the upper side 121 of the wafer or die 120. In one example, the copper structure 126 provides a copper pillar or post for subsequent soldering to a substrate or chip carrier using the solder ball 130. In one example, the lateral dimensions of the conductive seed layer 124 and the copper structure 126 (e.g., along the X-axis direction in FIG. 1) are approximately equal to one another.

In one example, the deposited (e.g., printed) polymer material 128 is disposed on (e.g., extends to) a lateral side of the copper structure 126. In another example, the printed polymer material 128 is spaced from at least one lateral side of the copper structure 126. The printed polymer material 128 in certain examples provides a repassivation layer that protects the copper structure 126 and passivates the copper surface thereof. In addition, the printed polymer material 128 in certain examples mechanically strengthens the base of the copper pillar structure 126 during assembly to a carrier substrate (not shown). In one example, the printed polymer material 128 is a thermally cured material that includes one or more of a polyimide, a polybenzoxazole (PBO), an epoxy, or a bismaleimide. In another example, the printed polymer material 128 is an ultraviolet (UV) curable material that includes one or more of a pre-imidized polyimide, an epoxy, an acrylate, a blend or copolymer of epoxy and acrylic crosslinkers, a blend or copolymer of epoxy and phenolic crosslinkers, or a blend or copolymer of epoxy and vinyl crosslinkers. As used herein, a blend is a mixture of components that may or may not react to each other, and a copolymer is a system derived from two or more monomer species that react together. As detailed further below in connection with FIGS. 2-11, the material 128 can be printed using a variety of additive deposition and curing steps, such as inkjet printing and thermal and/or UV curing, to improve material usage, mitigate copper migration, reduce production costs, and to facilitate extension to higher copper density while reducing the number of masks in production. As shown further below in FIG. 12, the device 100 can also include a conductive redistribution layer and a second printed polymer material.

Figure 11:
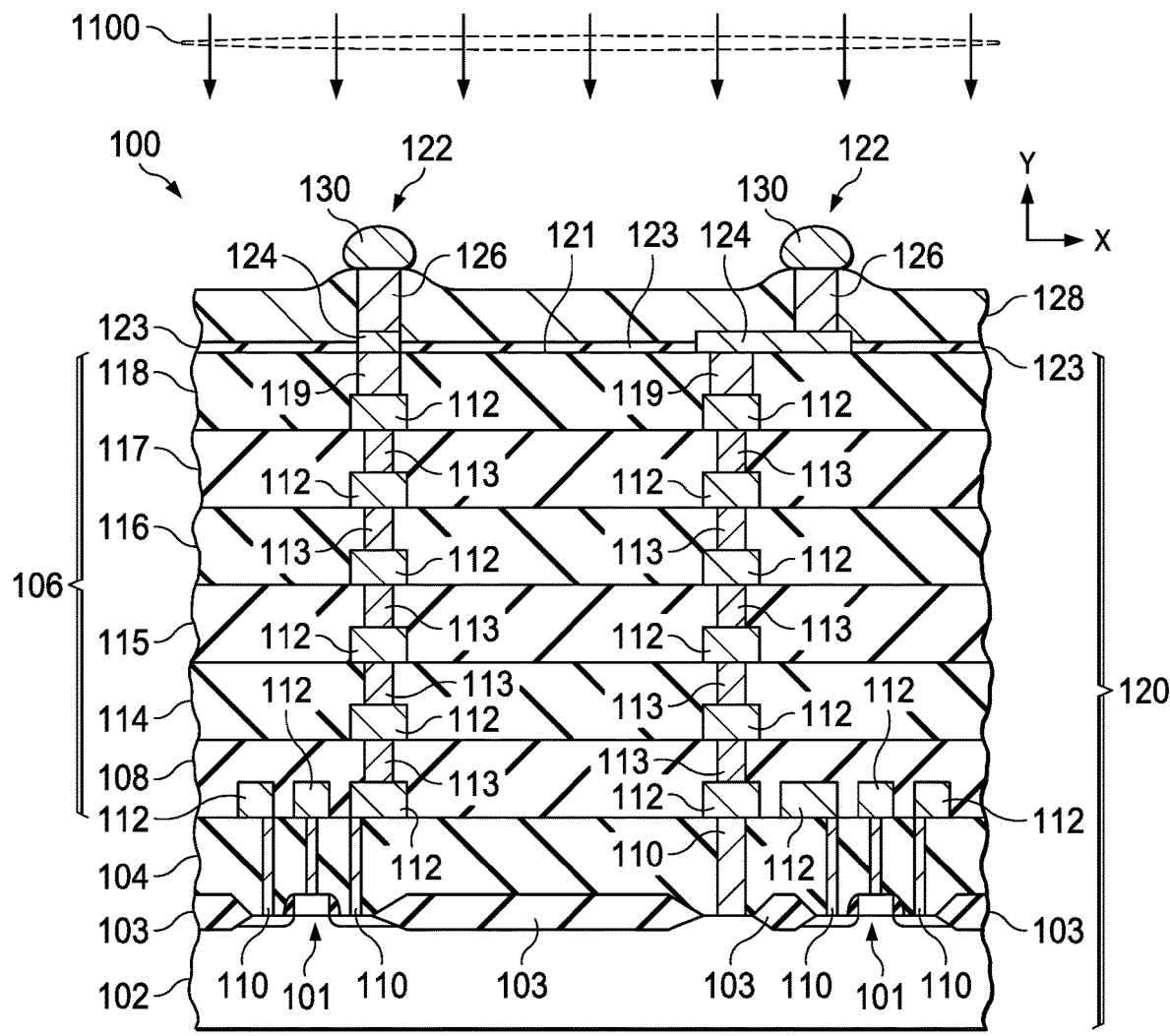
Figure 12:
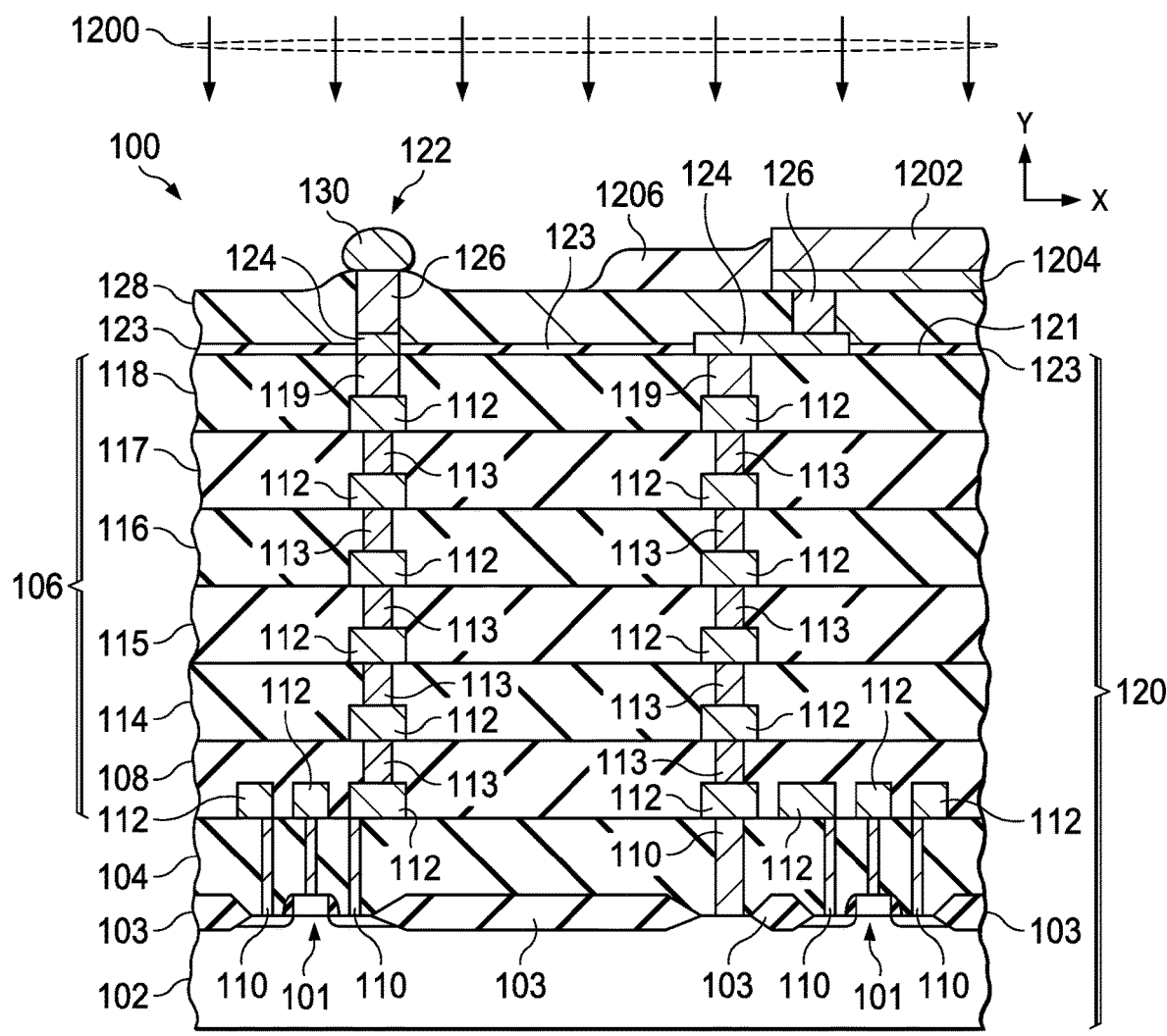
Figure 13:
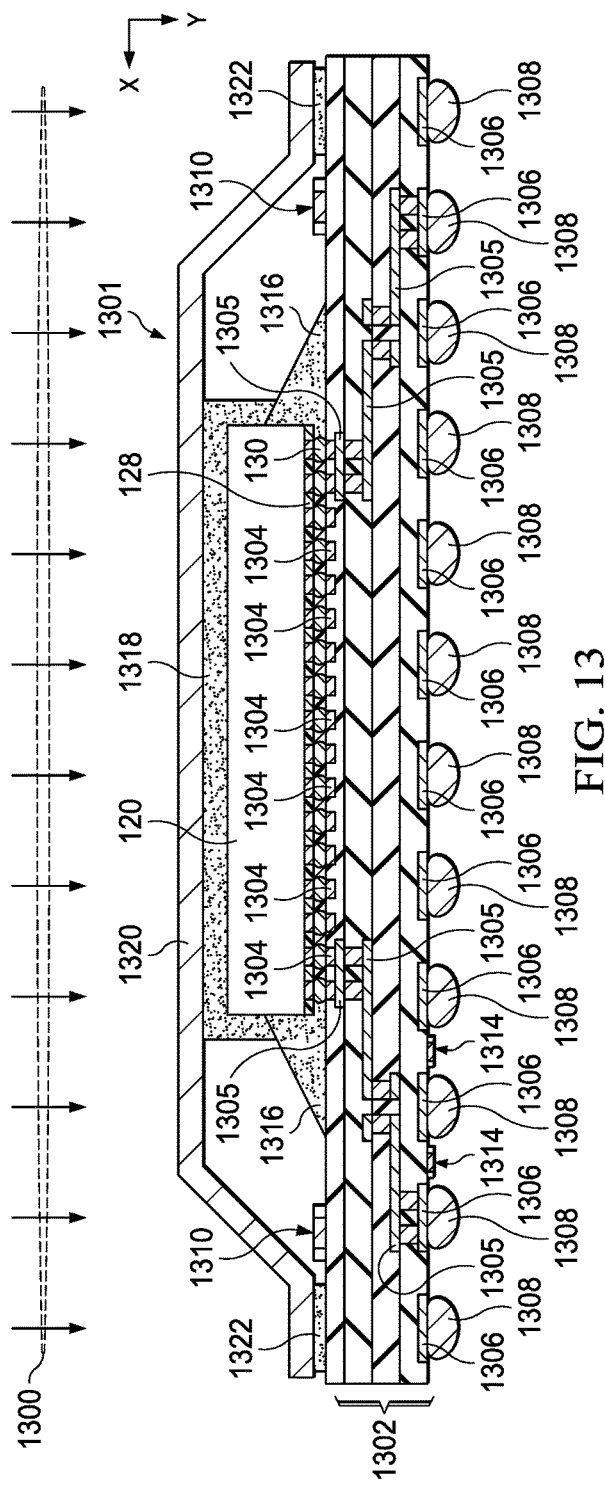
FIG. 13 is a partial sectional side elevation view of a packaged microelectronic device.

Referring also to FIGS. 2-13, FIG. 2 shows a method 200 of fabricating a microelectronic device, such as the device 100 of FIG. 1. The example method 200 also includes die singulation and packaging of the device 100 to provide an integrated circuit product. FIGS. 3-12 illustrate processing at various intermediate stages of fabrication to produce the device 100 of FIG. 1 according to the method 200, and FIG. 13 shows a packaged microelectronic device.

Figure 2:
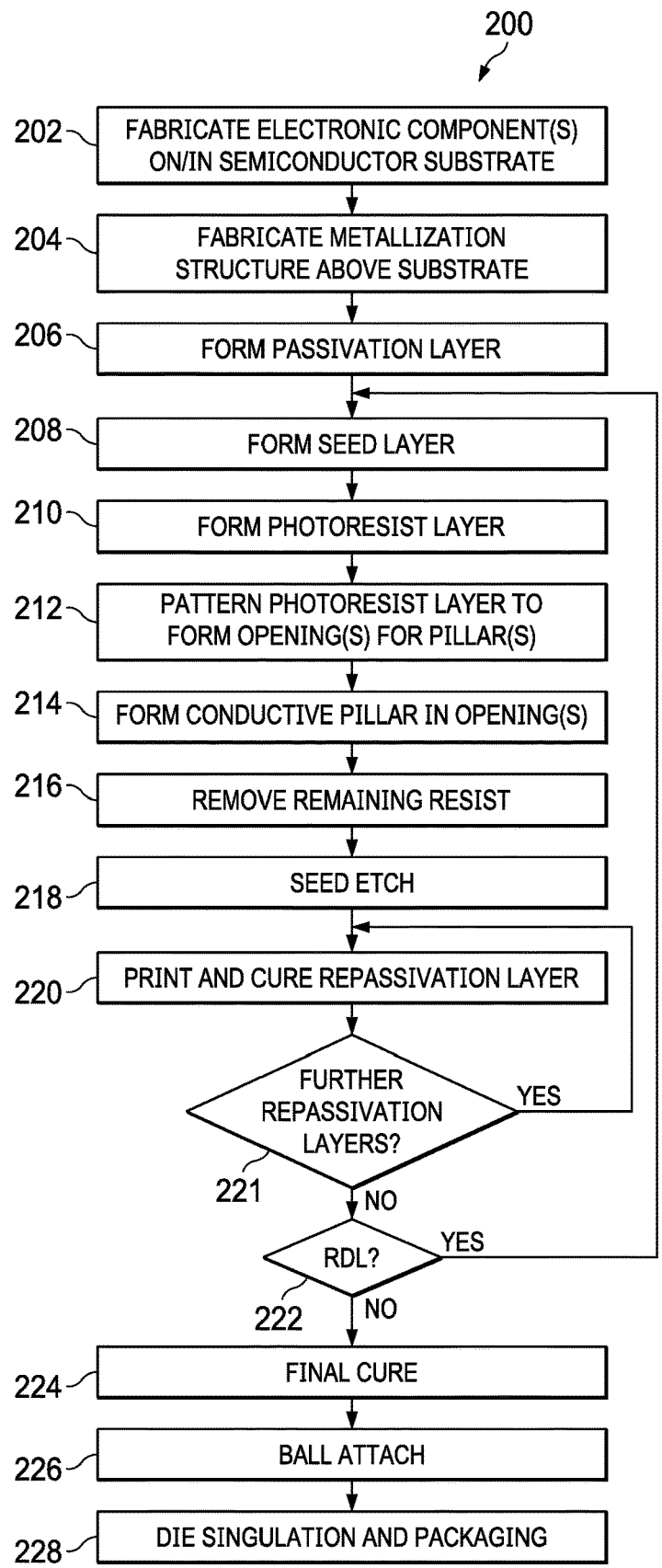
FIG. 2 is a flow diagram of a method of fabricating a microelectronic device and a contact structure thereof.
Figure 3:
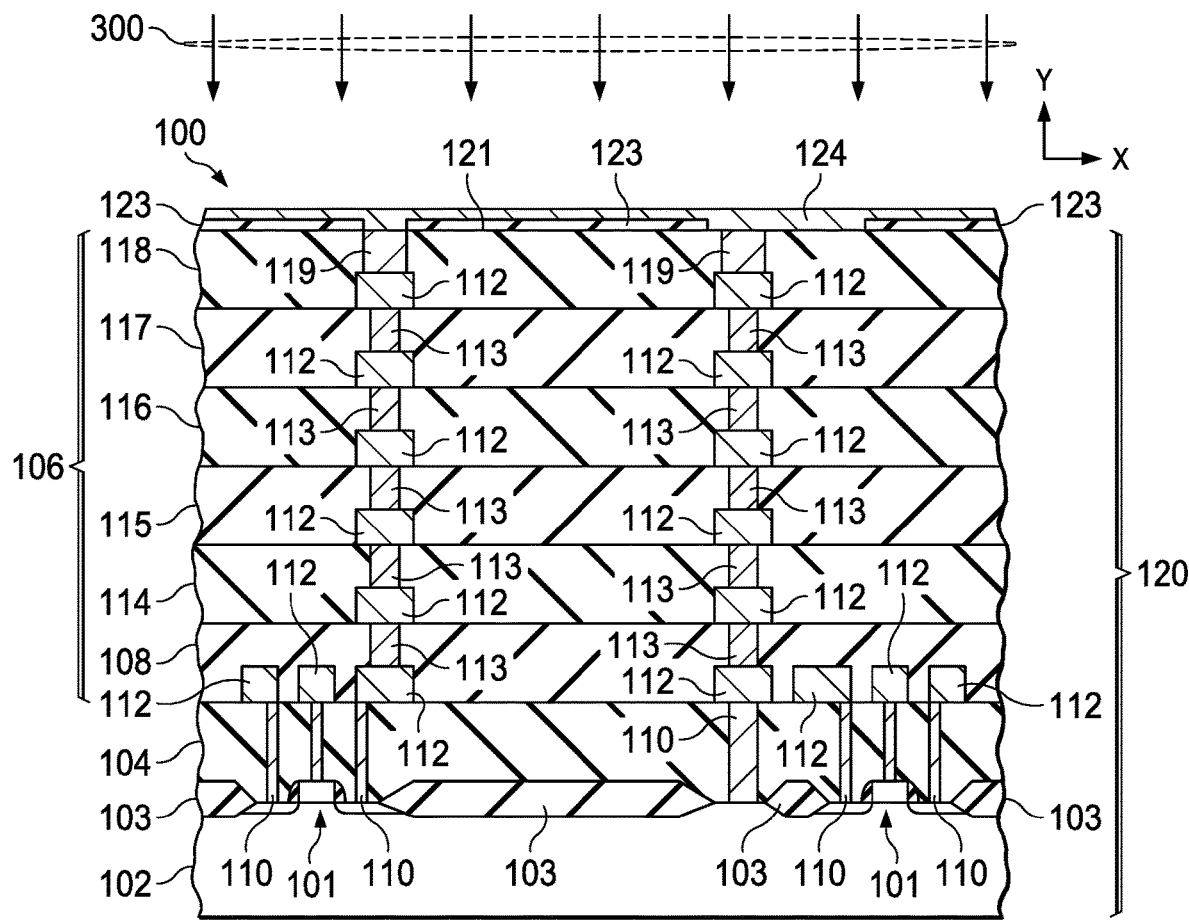
FIGS. 3-12 are partial sectional side elevation views of a microelectronic device undergoing fabrication processing according to the method of FIG. 2.

The method 200 in FIG. 2 includes fabricating one or more electronic components on and/or in a substrate at 202. Any suitable semiconductor processing steps can be used at 202 in order to fabricate one or more electronic components on and/or in a semiconductor substrate 102. For example, the processing at 202 can include fabricating one or more transistors 101 on and/or in the semiconductor substrate 102 as shown in FIG. 3. In one example, the fabrication processing at 202 includes fabrication of additional structural features, such as isolation structures 103 shown in FIG. 3. The method 200 of FIG. 2 further includes fabricating a metallization structure above the substrate at 204 (e.g., first dielectric structure layer 104 and an upper metallization structure 106 above the substrate 102 in FIG. 3). FIG. 3 shows processing 300 used to fabricate the electronic components 101 and the metallization structures 104, 106. In certain examples, construction of the metallization structure at 204 can further include fabrication of one or more additional electronic components (e.g., resistors, inductors, capacitors, transformers, not shown) at least partially in the metallization structure. The method 200 further includes forming a passivation layer at 206. FIG. 3 shows one example, in which the processing 300 includes forming the passivation layer or layers 123 with openings that expose the upper portions of the conductive features 119 of the metallization structure 106 to allow electrical connection of the features 119 to subsequently formed contact structures.

The method 200 also includes forming a conductive seed layer at least partially on a conductive feature of the wafer 120 at 208. FIG. 3 shows one example, including performing a sputtering or electroplating deposition process 300 that deposits the conductive seed layer 124 on the upper side 121 of the wafer 120. In one example, a sputter deposition process 300 in FIG. 3 forms a titanium or titanium tungsten material conductive seed layer 124 on the wafer side 121, which extends at least partially on the conductive features 119 of the wafer 120. The processing at 202-208 in one example provides a wafer 120 as shown in FIG. 3. At this point in the fabrication process 200, the deposited seed layer material 124 also extends over the previously deposited passivation layer or layers 123 as shown in FIG. 3.

Figure 4:
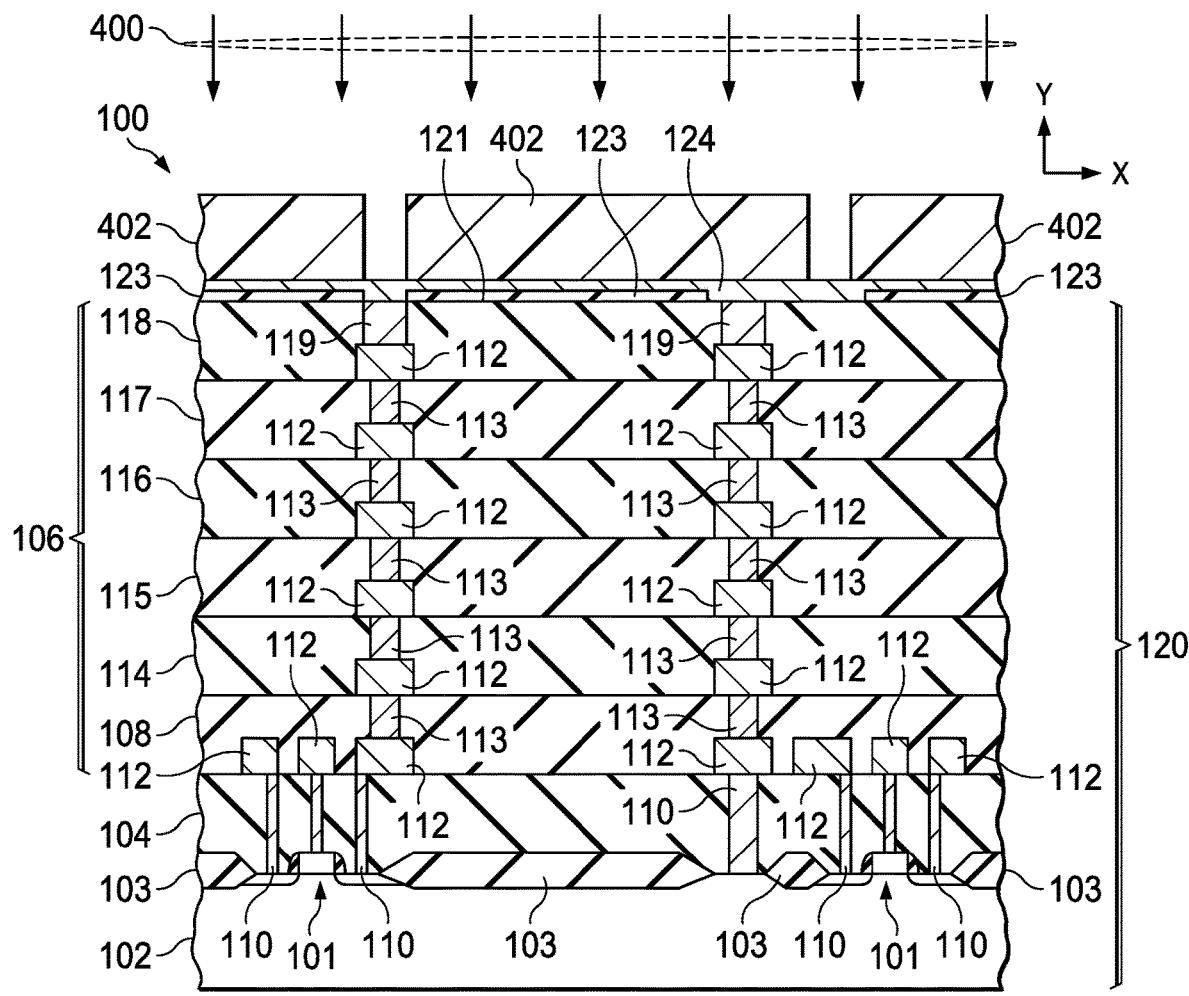

The method 200 continues in FIG. 2 with formation of a copper post or pillar structure above the deposited seed layer at 210-218. One example implementation includes forming a photoresist layer at 210, and patterning the photoresist layer at 212 to form openings for pillars. FIG. 4 shows an example deposition process 400 that deposits and patterns a photoresist material layer 402. The photoresist layer 402 in one example is patterned at 212 using a photolithography process that selectively removes portions of the photoresist material 402 to expose portions above the conductive features 119 of the wafer 120. The lateral (e.g., X-axis) width of the openings in the photoresist layer 402 in one example is generally coextensive with the lateral width of the conductive features 119 of the wafer 120, although not a requirement of all possible implementations.

Figure 5:
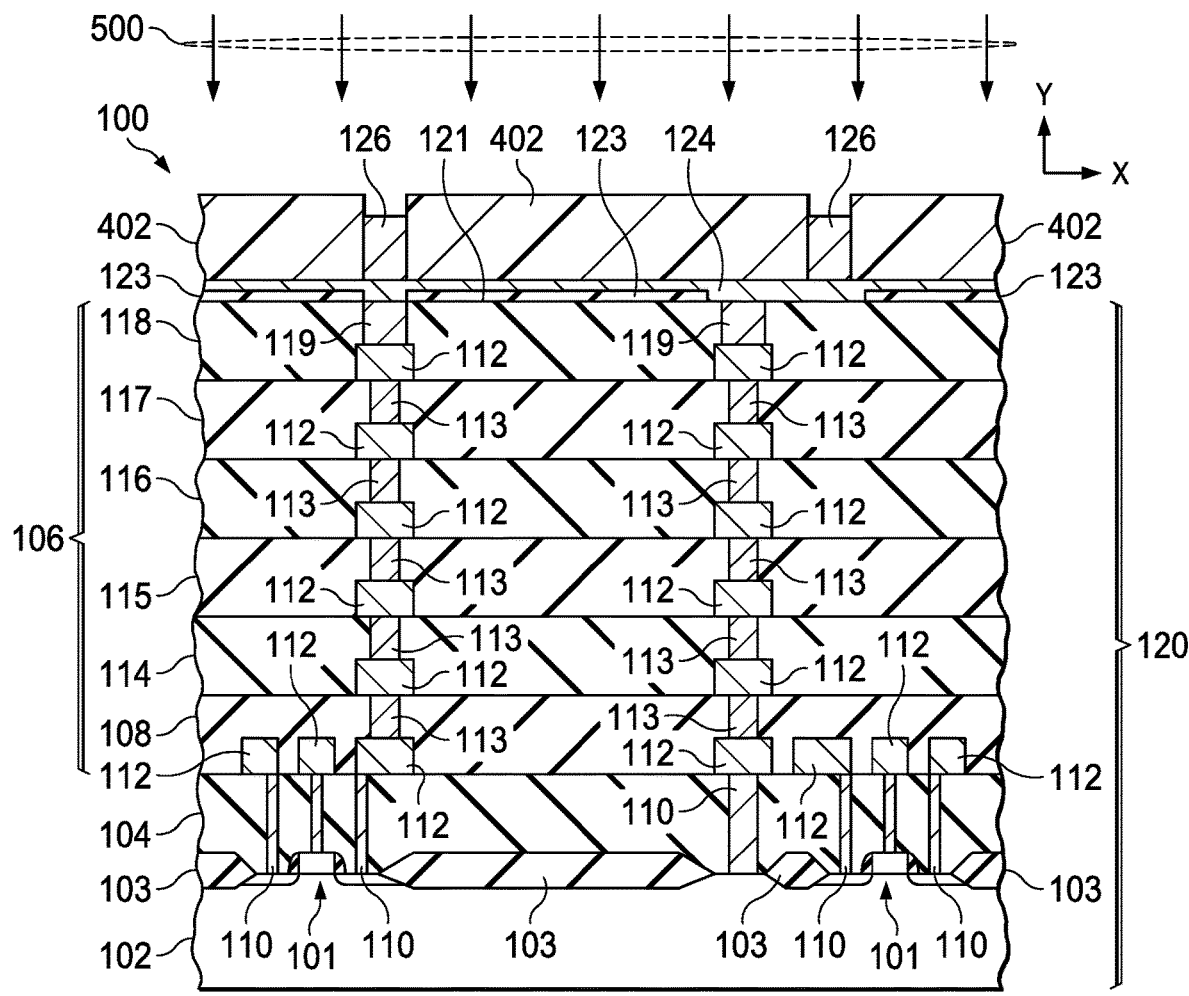

The method 200 further includes forming copper in the patterned openings at 214. The copper structure formation in this example includes depositing copper material at 214 on the exposed portion of the conductive feature. FIG. 5 shows one example, including performing an electroplating deposition process 500 that forms the copper structures 126 in the openings of the photoresist 402. The process 500 forms the copper structures 126 on the exposed portions of the conductive feature 119 of the wafer 120.

Figure 6:
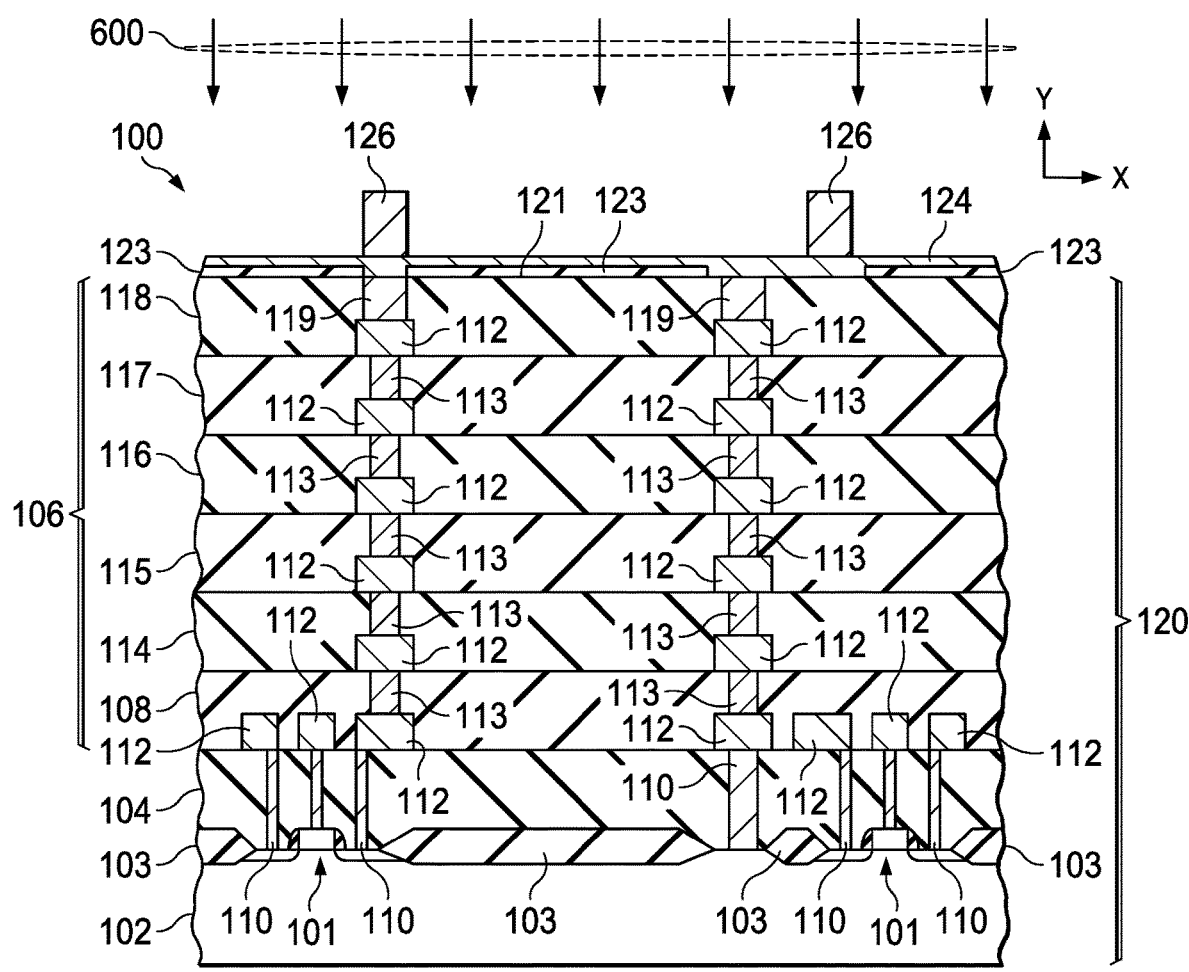
Figure 7:
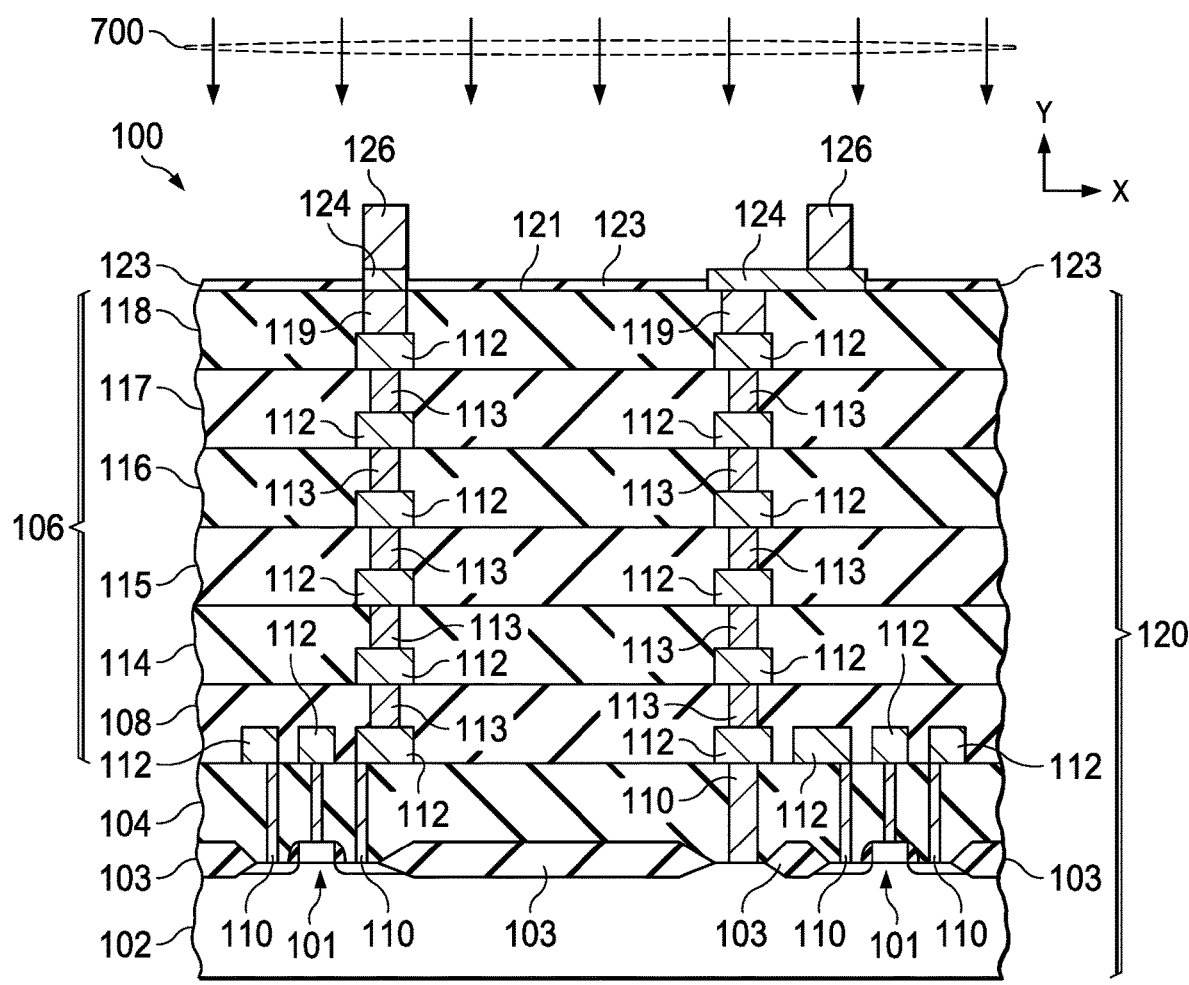

The method 200 continues at 216 in FIG. 2 with removal of the remaining resist layer. FIG. 6 shows a photoresist removal process 600 (e.g., selective etch) that removes the photoresist material 402 from the wafer 120. Although the example method 200 is illustrated and described above using a damascene type process to form the copper structures 126 using a patterned photoresist 402, other processing steps can be used to form a conductive copper structure on the seed layer 124 over the conductive feature 119 of the wafer 120. Moreover, although the illustrated example wafer 120 includes multiple conductive features 119 and corresponding contact structures 122, other implementations are possible in which only a single contact structure 122 is formed, and further examples are possible in which more than two contact structures 122 are formed. The method 200 continues with a seed etch at 218 that removes exposed portions of the seed layer 124. FIG. 7 shows an example in which an etch process 700 is performed that etches the exposed seed layer 124 to expose a portion of the passivation layer or layers 123.

Figure 8:
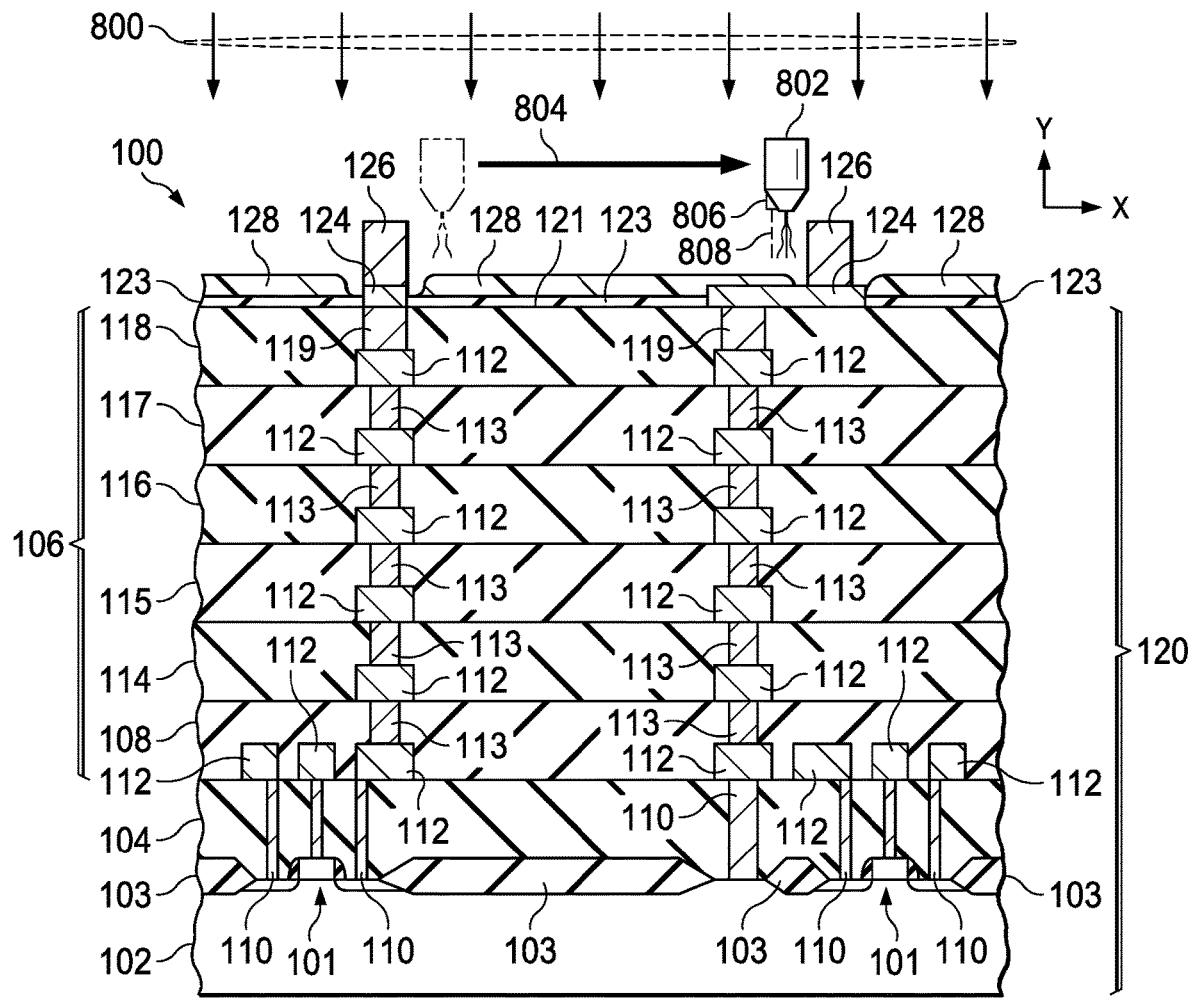

The method 200 also includes performing a printing process at 220 that forms a printed polymer material 128 on a side of the wafer 120 proximate a side of the conductive structure 126. FIG. 8 shows an example in which an inkjet printing process 800 is performed using a print head 802, which selectively prints or deposits the printed polymer material 128 on predetermined exposed portions of the passivation layer 123. As shown in FIG. 8, the printing processing 800 in one example prints the polymer repassivation material 128 slightly spaced laterally from the lateral sides of the copper pillar structures 126, although not a requirement of all possible implementations. Any suitable repassivation material and printing process can be used. In one example, a printable material 128 is used which has a viscosity of 10-30 cP, a surface tension of 20-40 mN/m, and a solids particle size of less than 200 nm, although not strict requirement of all possible implementations In one example, thermal-based inks are used, such as polyimide, epoxy, bismaleimide, where the thermal-based inks are solvent-diluted systems with a solids contents range of 20-35 wt % for thermal in situ and/or post-curing. In another example, UV-based inks are printed at 220, such as pre-imidized polyimide, epoxy, acrylate, blend or copolymer of epoxy and acrylic crosslinkers, blend or copolymer of epoxy and phenolic crosslinkers, blend or copolymer of epoxy and vinyl crosslinkers, where the UV-based inks include UV initiators to start the polymerization. In some examples, the UV-based inks are solventless systems. In other examples, UV-based inks can be used which are solvent-diluted systems with solids contents between 20-35 wt %. In certain examples, post-cured UV-based inks can be used. In other examples, UV-based inks can be printed using a print head with a UV light source (e.g., 806 in FIG. 8) to at least partially thermally cure (e.g., "pin") the printed material 128 to the printed surface during printing, alone or in combination with subsequent final curing (e.g., at 224 in FIG. 2).

The printing processing at 220 advantageously economizes consumption of the polymer repassivation material 128. FIG. 8 illustrates one example using an inkjet printer apparatus programmed according to a design layout of the wafer 120, where the print head 802 moves along a programmed path 804 to selectively print the material 128 in desired locations on the top side of the wafer 120. In one example, an initial curing function is implemented concurrently with the printing at 220 to at least partially cure the repassivation material 128 during printing. One example implementation includes heating the wafer 120 while performing the printing process at 220 to at least partially cure the polymer material 128. In another example, the print head 802 is equipped with an ultraviolet light source 806 that emits ultraviolet light 808 as shown in FIG. 8 during the printing process at 220. This example includes exposing the polymer material 128 to ultraviolet light while performing the printing process to at least partially cure the polymer material 128.

Figure 9:
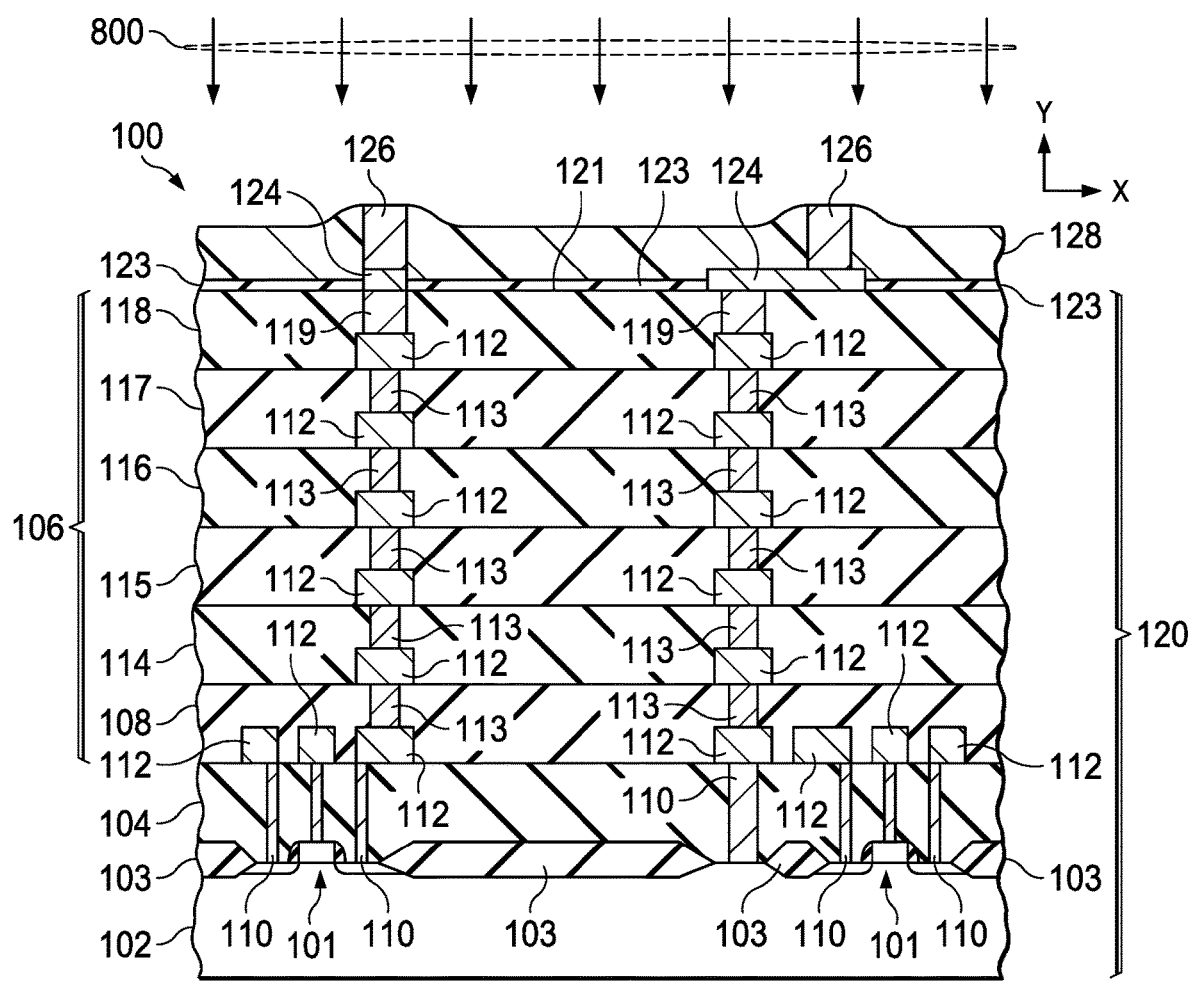

A single printed repassivation layer 128 can be formed in certain examples. In other examples, the printing processing includes performing multiple printing passes to deposit multiple layers of the polymer material 128 proximate the side of the conductive structure 126. In one example, the process 200 further includes determining at 221 whether further passivation layers are desired. Multiple repassivation material layers 128 can be printed, for example, in order to control the final thickness of the repassivation material layer 128 for a given design. If a further passivation material layer is desired (YES at 221), another repassivation layer is printed and optionally partially cured at 220. FIGS. 8 and 9 show one example implementation, including printing a first layer of the polymer repassivation material 128 in FIG. 8, followed by printing one or more additional layers using the process 800 in order to form a multilayer repassivation material structure 128 as shown in FIG. 9. If no additional repassivation layers are desired (NO at 221), the example method 200 includes determining whether a redistribution layer (RDL) is desired at 222. If so (YES at 222), the method 200 returns to 208 as described above to form an RDL structure and associated second repassivation layer.

Figure 10:
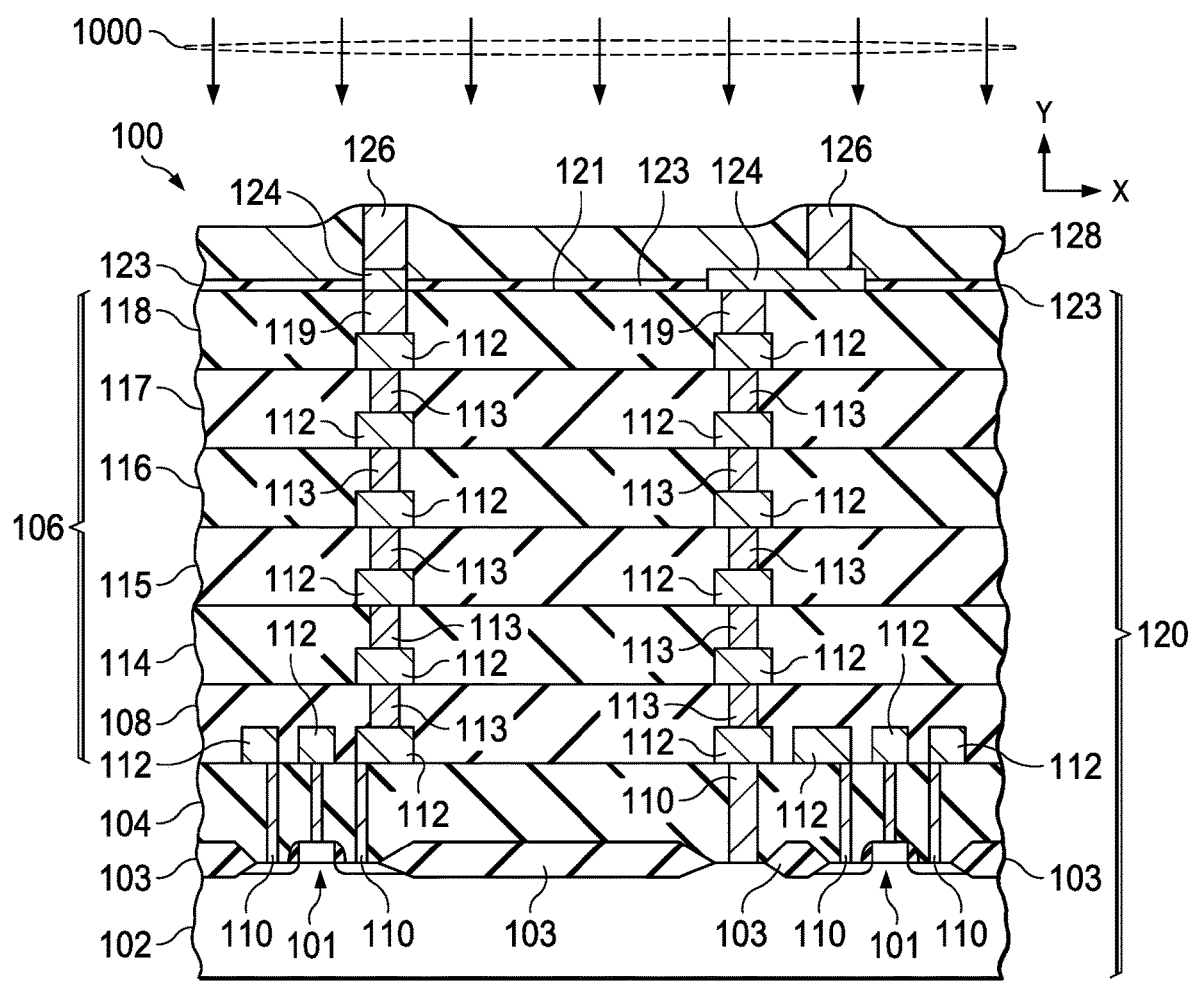

The example method 200 continues at 224 in FIG. 2, with a final curing process that thermally cures the polymer material 128, after performing 220 the printing process 800. FIG. 10 shows the wafer 120 undergoing a final curing process 1000 that cures the printed polymer material 128. In one example, the final cure process 1000 is a thermal process, for example, that heats the wafer 120 for a suitable duration at an appropriate temperature to cure the polymer material 128. As shown in FIG. 10, the final cure processing at 224 in one example adheres at least some of the printed polymer material 128 to the lateral sides of the conductive copper pillar structures 126, for example, through wicking action. In another example, the final cure processing at 224 includes exposing the wafer 120 to ultraviolet light, for example, to cure a UV curable printed polymer material 128.

The method 200 also includes attaching a solder ball structure to a side of the conductive structure 126 at 226 for subsequent assembly processing. FIG. 11 shows one example, in which a ball-attach process 1100 is performed that attaches solder balls 130 to the top surfaces of the exposed portions of the conductive copper pillar structures 126.

As discussed above, one example of the method 200 includes redistribution layer fabrication processing (e.g., YES at 222). FIG. 12 shows an example of the wafer 120 undergoing further processing 1200 according to the method 200. One example includes forming a conductive redistribution layer (e.g., at 214 in FIG. 2) 1202 over a portion of the conductive structure 126 after performing 220 the repassivation layer printing process. In one example, moreover, the RDL processing further involves forming an associated seed layer 1204 as shown in FIG. 12. The RDL processing 1200 in this example also includes performing a second printing process (e.g., at 220 in FIG. 2) that forms a second polymer material 1206 on the side of the wafer 120 proximate the lateral side of the conductive redistribution layer 1202, as shown in FIG. 12.

The method 200 in FIG. 2 also includes die singulation (e.g., separation of the wafer 120 into two or more dies) and packaging at 228 to provide a completed microelectronic device, whether including a single electronic component 101, or an integrated circuit that includes multiple electronic components 101 as well as a package structure that encloses the die 120 and provides electrical connection to the conductive contact structure 122. The device can be used in a variety of different product configurations, such as fine pitch flip chip packages (e.g., FCBGA), flip chip on lead packages (e.g., FCOL), and wafer level chip scale packages (WLCSP), etc.

FIG. 13 shows an example packaged flip chip ball grid array (FCBGA) integrated circuit (IC) 1301 resulting from packaging processing 1300 using the wafer 120 of FIG. 11. The flip chip implementation uses small print head tips to print the passivation material (e.g., print head 802 in FIG. 8 above). Lower resolution printing equipment can be used to print the passivation material 128 for WLCSP devices.

The example IC 1301 in FIG. 13 includes the die 120 soldered to a substrate or carrier 1302 using the solder balls 130. In one example, at 228 in FIG. 2, the die 120 is soldered to the carrier substrate 1302 using a surface mount technology (SMT) process that solders the solder balls 130 to conductive pads 1304 on an upper side of the carrier substrate 1302. The reflow of the solder balls 130 creates a solder joint between the conductive copper pillar structures 126 of the die 120 and the conductive pads 1304 of the PCB 1302. The IC 1301 also includes conductive pads 1306 located on the bottom side of the carrier substrate 1302, along with corresponding solder balls 1308 to allow the IC 1301 to be soldered to an end-user printed circuit board (not shown).

In this example, the carrier substrate 1302 also includes capacitors or other electronic components 1310 soldered to the upper or top side of the carrier substrate 1302, as well as additional exposed (e.g., lower side) electronic components (e.g., capacitors) 1314 on the bottom side of the carrier substrate 1302. The finished IC 1301 in FIG. 13 also includes an underfill adhesive material 1316 (e.g., epoxy) that seals the soldered connection between the die 120 and the carrier substrate 1302. In one example, the carrier substrate 1302 is a multilayer printed circuit board structure including a printed circuit board material, such as polyimide, glass-reinforced epoxy laminate material (e.g., flame retardant FR-4 material compliant with the UL94V-0 standard) or substrate build-up technology with Ajinomoto build-up film (ABF) dielectric layers laminated between copper layers above and below a rigid core material. The substrate 1302 can be a single layer structure or a multi-layer substrate in other examples. The substrate 1302 in one example includes plated through holes and/or micro-vias, some or all of which provide electrical interconnection between dielectric layers of a multi-layer structure. The substrate 1302 also includes traces or conductive routing features on a top side, a bottom side, and/or within or between internal layers selectively connected by conductive vias structures. The illustrated example includes conductive connections 1305 (e.g., aluminum and/or copper). The individual connections 1305 electrically connect one or more of the conductive pads 1304 on the upper side of the substrate 1302 to one or more associated conductive pads 1306 on the bottom side of the substrate 1302. The connections 1305 include one or more of the trace layers and vias structures. The example IC 1301 also includes a lid or heat spreader structure 1320 (e.g., nickel plated copper, AlSiC, Al, etc.) mounted to a top surface of the die 120 via a thermal interface material 1318 (e.g., silicone gel, etc.), along with a conductive or nonconductive lid seal adhesive 1322 that holds outer portions of the lid 1320 to the carrier substrate 1302.

Figure 14:
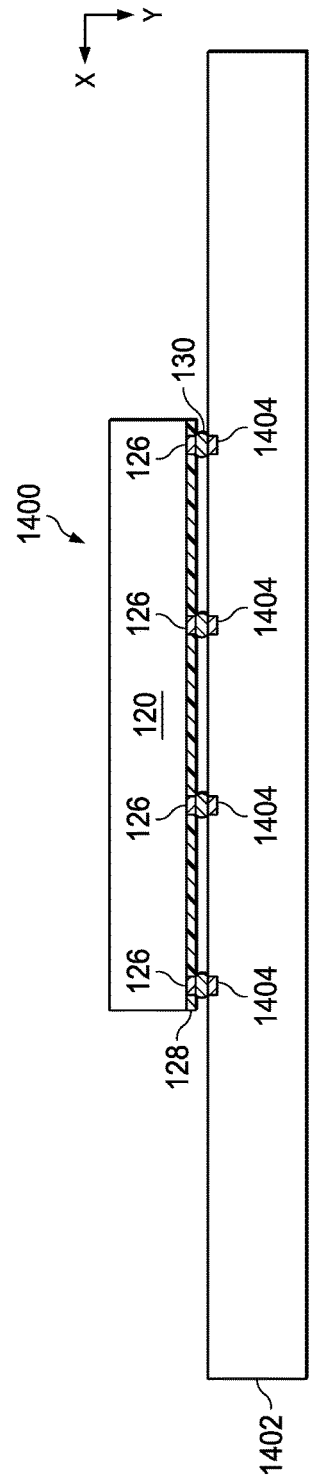
FIG. 14 is a partial sectional side elevation view of another packaged microelectronic device.

FIG. 14 shows an example packaged wafer level chip scale package (WLCSP) IC 1400 that includes the die 120 is soldered to a host printed circuit board (PCB) 1402 using SMT processing (not shown) that solders the solder balls 130 to conductive pads 1404 on an upper side of the PCB 1402. In this embodiment, a surface mount technology process is performed at 228 in FIG. 2 to reflow the solder balls 130 to create a solder joint between the conductive copper pillar structures 126 of the die 120 and the conductive pads 1404 of the PCB 1402.

Figure 15:
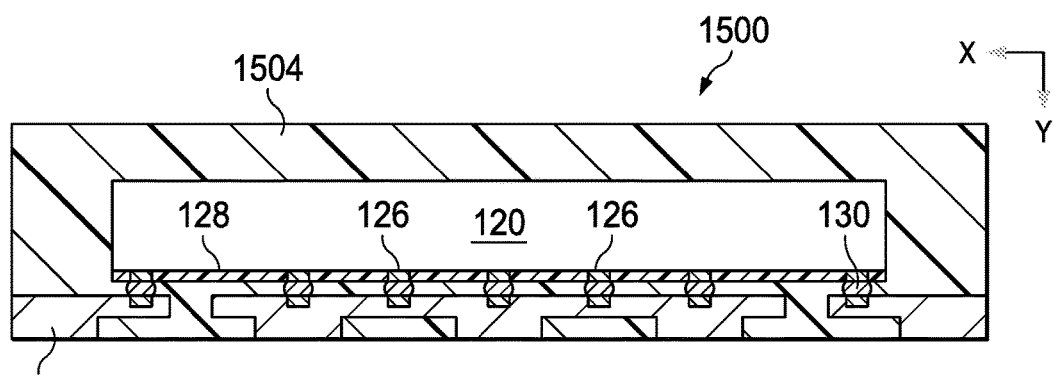
FIG. 15 is a partial sectional side elevation view of another packaged microelectronic device.

FIG. 15 shows an example packaged flip chip on lead (FCOL) IC 1500. The IC 1500 is a molded package lead frame assembly that includes the die 120 soldered to leads of a conductive metal lead frame structure 1502. The die 120 and the leadframe are encapsulated in a ceramic structure or a molded material 1504, such as plastic. The lead frame 1502 and the material 1504 encloses the die 120. Portions of the lead frame 1502 are not covered by the material 1504 to allow electrical connection of user circuit board pads to the conductive contact structure 122 when the IC 1500 is soldered to a host printed circuit board (not shown).

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

What is claimed is:

1. A method, comprising:
    forming a conductive seed layer at least partially above a conductive feature of a wafer;
    forming a conductive structure on at least a portion of the conductive seed layer;
    performing a printing process that forms a polymer material on a side of the wafer proximate a side of the conductive structure;
    curing the deposited polymer material; and
    attaching a solder ball structure to a side of the conductive structure.

2. The method of claim 1, wherein performing the printing process includes performing multiple printing passes to deposit multiple layers of the polymer material proximate the side of the conductive structure.

3. The method of claim 2, wherein curing the deposited polymer material includes:
    heating the wafer while performing the printing process to at least partially cure the polymer material.

4. The method of claim 3, wherein curing the deposited polymer material further includes:
    after performing the printing process, performing a final curing process that thermally cures the polymer material.

5. The method of claim 2, wherein curing the deposited polymer material includes:
    exposing the polymer material to ultraviolet light while performing the printing process to at least partially cure the polymer material.

6. The method of claim 5, wherein curing the deposited polymer material further includes:
    after performing the printing process, performing a final curing process that UV cures the polymer material.

7. The method of claim 1, further comprising:
    after performing the printing process, forming a conductive redistribution layer over a portion of the conductive structure;
    after forming the conductive redistribution layer, performing a second printing process that forms a second polymer material on the side of the wafer proximate a side of the conductive redistribution layer; and
    performing a final curing process that thermally cures the polymer material and the second polymer material.

8. The method of claim 7, wherein curing the deposited polymer material includes:
    heating the wafer while performing the printing process to at least partially cure the polymer material.

9. The method of claim 7, wherein curing the deposited polymer material includes:
    exposing the polymer material to ultraviolet light while performing the printing process to at least partially cure the polymer material.

10. The method of claim 1, wherein curing the deposited polymer material includes: heating the wafer while performing the printing process to at least partially cure the polymer material.

11. The method of claim 10, wherein curing the deposited polymer material further includes:
    after performing the printing process, performing a final curing process that thermally cures the polymer material.

12. The method of claim 1, wherein curing the deposited polymer material includes: exposing the polymer material to ultraviolet light while performing the printing process to at least partially cure the polymer material.

13. The method of claim 12, wherein curing the deposited polymer material further includes:
    after performing the printing process, performing a final curing process that UV cures the polymer material.

14. A device, comprising:
    an electronic component disposed on or in a semiconductor substrate;
    a metallization structure disposed over the semiconductor substrate, including a conductive feature;
    a conductive contact structure electrically coupled with the conductive feature, the conductive contact structure extending outward from a side of the metallization structure;
    a printed polymer material disposed on the side of the metallization structure proximate a side of the conductive contact structure; and
    a solder ball structure connected to the conductive structure.

15. The device of claim 14,
    wherein the conductive contact structure includes a conductive seed layer disposed over the conductive feature, and a copper structure that extends outward from the side of the metallization structure; and
    wherein the printed polymer material is disposed on a side of the copper structure.

16. The device of claim 14, wherein the printed polymer material includes a polyimide, a polybenzoxazole (PBO), an epoxy, or a bismaleimide.

17. The device of claim 14, wherein the printed polymer material includes a pre-imidized polyimide, an epoxy, an acrylate, a blend or copolymer of epoxy and acrylic cross-linkers, a blend or copolymer of epoxy and phenolic cross-linkers, or a blend or copolymer of epoxy and vinyl cross-linkers.

18. The device of claim 14, further comprising:
    a conductive redistribution layer extending outward from a side of the metallization structure; and
    a second printed polymer material disposed on the side of the metallization structure proximate a side of the conductive redistribution layer.

19. An integrated circuit (IC), comprising:
    a die, including:
        a semiconductor substrate, including an electronic component, and
        a metallization structure disposed over the semiconductor substrate, the metallization structure including a conductive feature;
    a conductive contact structure electrically coupled with the conductive feature, the conductive contact structure extending outward from a side of the metallization structure;

a printed polymer material disposed on the side of the metallization structure proximate a side of the conductive contact structure; and a package structure that encloses the die and provides electrical connection to the conductive contact structure.

20. The IC of claim 19, wherein the printed polymer material includes a polyimide, a polybenzoxazole (PBO), are epoxy, a bismaleimide, a pre-imidized polyimide, an acrylate, a blend or copolymer of epoxy and acrylic cross-linkers, a blend or copolymer of epoxy and phenolic cross-linkers, or a blend or copolymer of epoxy and vinyl cross-linkers.

21. An integrated circuit (IC), comprising:
  a die, including:
    a semiconductor substrate, including an electronic component, and
    a metallization structure disposed over the semiconductor substrate, the metallization structure including a conductive feature;
  a conductive contact structure electrically coupled with the conductive feature, the conductive contact structure extending outward from a side of the metallization structure;
  a printed polymer material disposed on the side of the metallization structure proximate a side of the conductive contact structure; and
  a package structure that encloses the die and provides electrical connection to the conductive contact structure, wherein the package structure includes a substrate, having a first side with a conductive pad soldered to the conductive contact structure, a second side with a conductive pad electrically connected to the conductive pad of the first side, and a solder ball soldered to the conductive pad of the second side.

22. An integrated circuit (IC), comprising:
  a die, including:
    a semiconductor substrate, including an electronic component, and
    a metallization structure disposed over the semiconductor substrate, the metallization structure including a conductive feature;
  a conductive contact structure electrically coupled with the conductive feature, the conductive contact structure extending outward from a side of the metallization structure;
  a printed polymer material disposed on the side of the metallization structure proximate a side of the conductive contact structure; and
  a package structure that encloses the die and provides electrical connection to the conductive contact structure, wherein the package structure includes;
    a conductive metal lead frame structure, including a lead soldered to the conductive contact structure; and
    a ceramic structure or molded material that encapsulates the die, the conductive contact structure, the printed polymer material, and a portion of the conductive metal lead frame structure.

23. A method for fabricating an integrated circuit (IC), the method comprising:
  forming a conductive seed layer at least partially above a conductive feature of a wafer;
  forming a conductive structure on at least a portion of the conductive seed layer;
  performing a printing process that forms a polymer material on a side of the wafer proximate a side of the conductive structure;
  curing the deposited polymer material;
  attaching a solder ball structure to a side of the conductive structure;
  separating a die from the wafer; and
  creating a package structure package structure that encloses the die and provides electrical connection to the conductive contact structure.

24. A method for fabricating an integrated circuit (IC), the method comprising:
  forming a conductive seed layer at least partially above a conductive feature of a wafer;
  forming a conductive structure on at least a portion of the conductive seed layer;
  performing a printing process that forms a polymer material on a side of the wafer proximate a side of the conductive structure, including performing multiple printing passes to deposit multiple layers of the polymer material proximate the side of the conductive structure;
  curing the deposited polymer material;
  attaching a solder ball structure to a side of the conductive structure;
  separating a die from the wafer; and
  creating a package structure package structure that encloses the die and provides electrical connection to the conductive contact structure.

25. A method for fabricating an integrated circuit (IC), the method comprising:
  forming a conductive seed layer at least partially above a conductive feature of a wafer;
  forming a conductive structure on at least a portion of the conductive seed layer;
  performing a printing process that forms a polymer material on a side of the wafer proximate a side of the conductive structure;
  heating the wafer while performing the printing process to at least partially cure the polymer material;
  attaching a solder ball structure to a side of the conductive structure;
  separating a die from the wafer; and
  creating a package structure that encloses the die and provides electrical connection to the conductive contact structure.

26. A method for fabricating an integrated circuit (IC), the method comprising:
  forming a conductive seed layer at least partially above a conductive feature of a wafer;
  forming a conductive structure on at least a portion of the conductive seed layer;
  performing a printing process that forms a polymer material on a side of the wafer proximate a side of the conductive structure;
  exposing the polymer material to ultraviolet light while performing the printing process to at least partially cure the polymer material;
  attaching a solder ball structure to a side of the conductive structure;
  separating a die from the wafer; and
  creating a package structure package structure that encloses the die and provides electrical connection to the conductive contact structure.

* * * * *

UNITED STATES PATENT AND TRADEMARK OFFICE
CERTIFICATE OF CORRECTION

PATENT NO. : 10,541,220 B1
APPLICATION NO. : 16/053199
DATED : January 21, 2020
INVENTOR(S) : Daiki Komatsu et al.

Page 1 of 1

It is certified that error appears in the above-identified patent and that said Letters Patent is hereby corrected as shown below:

In the Claims

Claim 23, Line 14, The term "package structure package structure" should instead be "package structure".

Claim 24, Line 17, The term "package structure package structure" should instead be "package structure".

Claim 26, Line 16, The term "package structure package structure" should instead be "package structure".

Signed and Sealed this
Eighth Day of April, 2025

Coke Morgan Stewart
*Acting Director of the United States Patent and Trademark Office*